United States Patent
Farmer et al.

(10) Patent No.: US 9,040,364 B2
(45) Date of Patent: May 26, 2015

(54) CARBON NANOTUBE DEVICES WITH UNZIPPED LOW-RESISTANCE CONTACTS

(71) Applicant: International Business Machines Corporation, Armonk, NY (US)

(72) Inventors: Damon B. Farmer, White Plains, NY (US); Aaron D. Franklin, Croton on Hudson, NY (US); Joshua T. Smith, Croton on Hudson, NY (US); George S. Tulevski, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 87 days.

(21) Appl. No.: 13/664,008

(22) Filed: Oct. 30, 2012

(65) Prior Publication Data

US 2014/0120714 A1    May 1, 2014

(51) Int. Cl.
    *H01L 21/84*    (2006.01)
    *H01L 21/02*    (2006.01)
    *H01L 29/06*    (2006.01)
    *H01L 51/00*    (2006.01)

(52) U.S. Cl.
    CPC ...... *H01L 21/02603* (2013.01); *H01L 29/0673* (2013.01); *H01L 21/02606* (2013.01); *H01L 29/0669* (2013.01); *H01L 29/0665* (2013.01); *H01L 51/0048* (2013.01); *Y10S 977/742* (2013.01)

(58) Field of Classification Search
    CPC ................ H01L 21/02603; H01L 21/02606; H01L 51/0048; H01L 51/0545; H01L 29/0665; H01L 29/0669; H01L 29/0673; H01L 29/1606

USPC ......... 438/197, 195, 177, 479, 610, 157, 149; 257/40, 347, 288, 29, 368, E51.04, 257/E29.72

See application file for complete search history.

(56) References Cited

U.S. PATENT DOCUMENTS

| | | | |
|---|---|---|---|
| 7,029,646 | B2 | 4/2006 | Margrave et al. |
| 7,701,014 | B2* | 4/2010 | Mostarshed et al. .......... 257/368 |
| 2011/0092054 | A1* | 4/2011 | Seo et al. ...................... 438/473 |
| 2011/0253969 | A1* | 10/2011 | Dai et al. ........................... 257/9 |
| 2011/0309334 | A1 | 12/2011 | Chang et al. |
| 2012/0175594 | A1* | 7/2012 | Chen et al. ...................... 257/29 |

OTHER PUBLICATIONS

J. Bai, et al., "Rational Fabrication of Graphene Nanoribbons Using a Nanowire Etch Mask," Nano Letters 2009 vol. 9, No. 5.; pp. 2083-2087.

Y. Chai, et al., "Low-Resistance Electrical Contact to Carbon Nanotubes With Graphitic Interfacial Layer," IEEE Transactions on Electrical Devices; vol. 59; No. 1; Jan. 2012; pp. 12-19.

(Continued)

*Primary Examiner* — Michael Trinh
(74) *Attorney, Agent, or Firm* — Cantor Colburn LLP; Louis Percello

(57) ABSTRACT

A method of creating a semiconductor device is disclosed. An end of a carbon nanotube is unzipped to provide a substantially flat surface. A contact of the semiconductor device is formed. The substantially flat surface of the carbon nanotube is coupled to the contact to create the semiconductor device. An energy gap in the unzipped end of the carbon nanotube may be less than an energy gap in a region of the carbon nanotube outside of the unzipped end region.

20 Claims, 3 Drawing Sheets

(56) References Cited

OTHER PUBLICATIONS

Z. Chen, et al., "The Role of Model-Nanotube Contact in the Performance of Carbon Nanotube Field-Effect Transistors," Nano Letters 2005; vol. 5, No. 7; pp. 1497-1502.

W. Kim, et al., "Electrical Contacts to Carbon Nanotubes Down to 1 nm in Diameter," Applied Physics Letters 87, 173101 (2005); pp. 173101-1-3.

D. Kosynkin, et al., "Longitudinal Unzipping of Carbon Nanotuber to Form Graphene Nanoribbons," Letter Nature vol. 458; Apr. 16, 2009; pp. 872-877.

Y. Matsuda, et al., "Contact Resistance for "End-Contacted" Metal—Graphene and Metal—Nanotube Interfaces from Quantum Mechanics," J. Phys. Chem. C 2010, 114, 178450-17850; Jun. 29, 2010; pp. 17845-17850.

D. Shahrjerdi, et al., "High Device Yield Carbon Nanotube NFETs for High-Performance Logic Applications," 2011 IEEE; pp. 23.3.1-4.

Q. Zhang, et al., "Reducing Electrical Resistance in Single-Walled Carbon Nanotube Networks: Effect of the Location of Metal Contacts and Low-Temperature Annealiing," J. Mater Sci (2012) 47; pp. 3233-3240.

International Search Report for International Application No. PCT/US13/52162; International filed Jul. 26, 2013; Issued Dec. 24, 2013. (16 pgs).

Margine et al. "Theory of genus reduction in alkali-induced graphitization of nanoporous carbon" Pyshical Review B 76, (2007) pp. 115436-1-115436-5.

Written Opinion for International Application No. PCT/US13/52162; International filing Jul. 26, 2013. Issued Dec. 24, 2013. (8 pgs).

\* cited by examiner

CARBON NANOTUBE DEVICES WITH UNZIPPED LOW-RESISTANCE CONTACTS

BACKGROUND

The present invention relates to carbon nanotube field effect transistors (FETs), and more specifically, to improving electrical coupling between contact metals and carbon nanotubes in carbon nanotube field effect transistors.

Carbon nanotube field-effect transistors generally include a carbon nanotube that spans a gap between a source contact and a drain contact and serves as the channel of the transistor, the conductance of which is modulated by a gate separated from the nanotube channel by a dielectric material. There exists a contact resistance at the interfaces between the carbon nanotube and the source/drain contacts due, in part, to difficulties in coupling the cylindrical surface of the carbon nanotube to the contacts. High contact resistance at the interface between the carbon nanotube and either of the contacts will reduce current injection into the nanotube channel, thereby decreasing the performance of the transistor. This problem of contact resistance is exacerbated at technologically relevant nanotube diameters that are less than about 2 nanometers (nm) where a Schottky barrier presents itself at the contact metal/nanotube interface. The band gap of the carbon nanotube increases inversely with respect to diameter and a sufficiently large bandgap (~0.6 eV) is necessary to attain a suitable on-/off-current ratio for digital applications. However, decreasing the diameter to achieve this bandgap leads to larger Schottky barriers and weaker coupling between the contact metal and the carbon nanotube thus increasing the contact resistance.

SUMMARY

According to one embodiment of the present invention, a method creating a semiconductor device includes: unzipping an end of a carbon nanotube to provide a substantially flat surface; forming a contact of the semiconductor device; and coupling the planar surface of the carbon nanotube to the contact to create the semiconductor device.

According to another embodiment of the present invention, a method of creating a carbon nanotube field-effect transistor includes: altering a physical structure of a segment of the carbon nanotube to reduce an energy gap in the altered segment; and coupling the altered segment to a contact to create the carbon nanotube field-effect transistor.

According to another embodiment of the present invention, a method of reducing a contact resistance in a carbon nanotube transistor includes: unzipping a segment of a carbon nanotube; forming a planar surface from the unzipped segment of the carbon nanotube; and coupling the planar surface to a contact of the carbon nanotube transistor.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1-6 illustrate an exemplary manufacturing process for creating an exemplary carbon nanotube field effect transistor in one embodiment of the present invention, in which:

FIG. 1 illustrates a starting substrate structure including a co-planar local bottom gate formed therein, a dielectric layer formed over the bottom gate, and a carbon nanotube deposited on the dielectric layer and aligned to the local bottom gate;

FIG. 2 illustrates a barrier material and a photoresist layer formed over the structure of FIG. 1;

FIG. 3 illustrates windows formed in the barrier material and a photoresist layer of FIG. 2 that expose ends of the carbon nanotube.

FIG. 4 illustrates unzipped ends of the carbon nanotube, which are formed by chemical treatment of the nanotube in the exposed window areas of FIG. 3;

FIG. 5 illustrates resist layer having windows for formation of source/drain contacts on the unzipped ends of FIG. 4;

FIG. 6 illustrates contact metal deposited onto the unrolled ends of the carbon nanotube;

DETAILED DESCRIPTION

Figure 1:
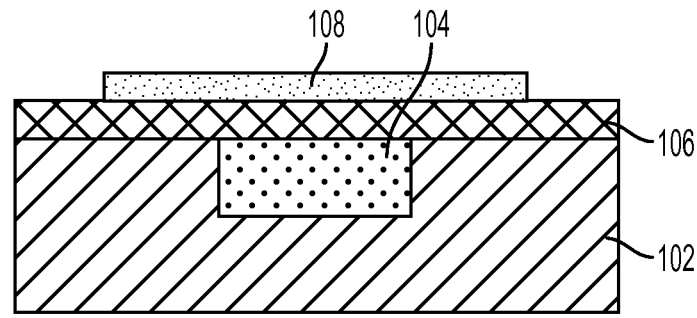

FIGS. 1-6 illustrate an exemplary manufacturing process for creating an exemplary carbon nanotube field effect transistor in one embodiment of the present invention. FIG. 1 illustrates a first stage of the manufacturing process. A substrate 102 is provided that has a co-planar local bottom gate 104 formed therein, filled with a bottom gate material, such as tungsten, for example. The substrate 102 may include silicon dioxide ($SiO_2$) in various embodiments. Top surfaces of the substrate 102 and of the local bottom gate 104 are substantially aligned to form a substantially planar surface using, for example, chemical mechanical polishing. A high-k dielectric layer 106 is formed on the planar surface of the substrate 102 and local bottom gate 104. The high-k dielectric layer 106 may be deposited using, for example, atomic layer deposition or other suitable deposition methods. Exemplary high-k dielectric material may include $HfO_2$ and $Al_2O_3$, among others. The high-k dielectric layer 106 may provide electrical isolation of the underlying gate 104 from transistor source and drain metals formed in later manufacturing processes. A carbon nanotube 108 is deposited on a top layer of the high-k dielectric material 106. The carbon nanotube 108 is generally aligned with the local bottom gate 102 so as to span the local bottom gate 104, such that the ends of the carbon nanotube 108 extend beyond the local bottom gate 104 and over the silicon substrate 102.

Figure 2:
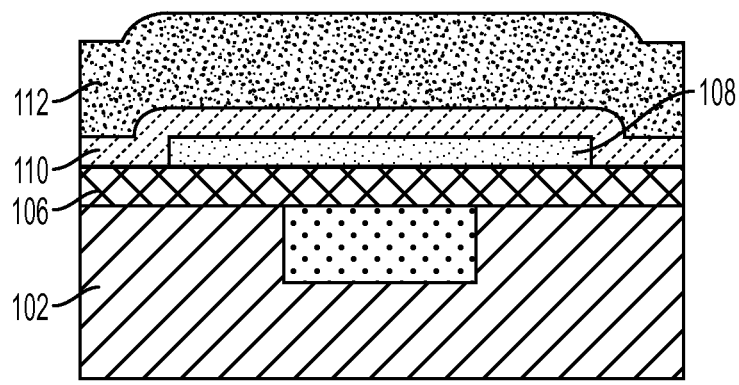

FIG. 2 illustrates a second stage of the manufacturing process. An etch barrier material 110 is deposited over the top surfaces of the high-k dielectric layers 106 and the carbon nanotube 108. In various embodiments, the barrier material 110 may be $Si_3N_4$, $Al_2O_3$ or other suitable barrier material. The etch barrier material serves as both a protective layer in later manufacturing steps to prevent chemical unzipping of the nanotube in a channel region of the carbon nanotube (discussed below) and a means to self-align the contact metals to the unzipped portion of the nanotube in the contact areas of the carbon nanotube (discussed below). A resist layer 112 is then formed on top of the barrier material 110.

Figure 3:
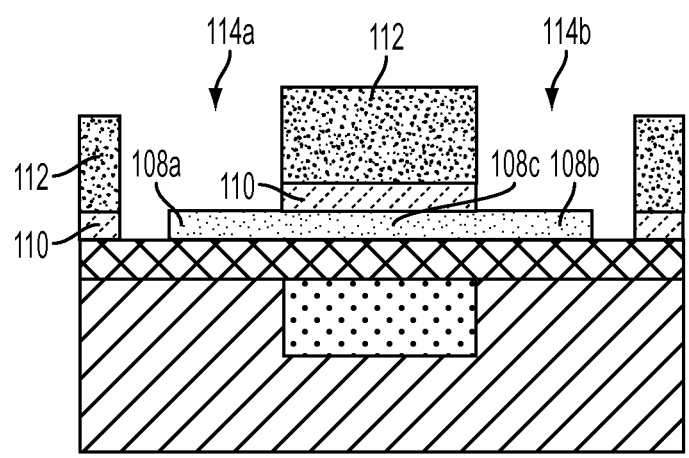

FIG. 3 illustrates a third stage of the manufacturing process. In this stage, windows 114a and 114b are formed in the resist layer 112 and transferred to the barrier material 110 by means of chemical etching. Windows 114a and 114b may be formed by standard lithographic processing of the resist layer 112 followed by wet etching of the barrier material 108a. In this way, the pattern defined in the resist layer 112 by windows 114a and 114b is transferred through exposed portions of the barrier material 110 so as to expose ends 108a and 108b of the carbon nanotube 108, while also still covering a middle segment of the carbon nanotube 108 that forms the channel region 108c of the carbon nanotube 108.

Figure 4:
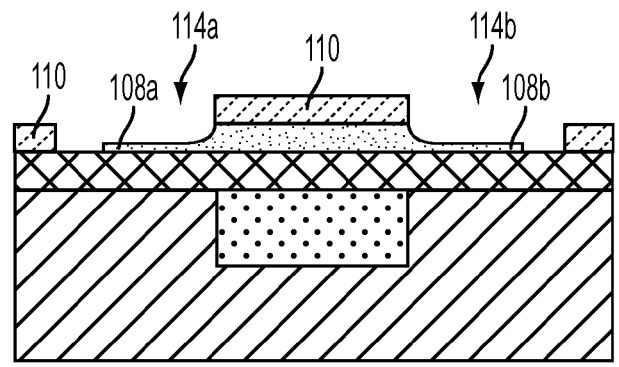

FIG. 4 illustrates a fourth stage of the manufacturing process. The resist layer 112 is removed and the ends of the carbon nanotube 108 in the exposed window areas 114a and 114b are unzipped and unrolled to form a planar surface of contact regions 108a and 108b, as disclosed herein. The planar surface is then disposed to lie substantially flat against the high-k dielectric layer 106. In one embodiment, unzipping an end of the carbon nanotube 108 includes forming a cut in the end of the carbon nanotube. In an exemplary embodiment, the cut is along a longitudinal direction of the carbon nanotube 108. Alternately, the cut may be along a spiral direction of the carbon nanotube 108. The cut may be formed by subjecting the exposed carbon nanotube contact regions 108a and 108b of the carbon nanotube 108 to a potassium permanganate ($KMnO_4$) mixture, for example. The potassium permanganate breaks bonds in the surface of the carbon nanotube 108, thereby creating two free edges of the carbon nanotube 108 in the contact regions 108a and 108b. The free edges include dangling bonds that enable the establishment of covalent bonds between contact metal (shown in FIG. 6) and the nanotube i.e. edge contacted devices. The barrier layer 110 may include a wetting layer to reduce air gaps between the barrier layer 110 and the carbon nanotube 108 to prevent access of the potassium permanganate or other chemical treatment to the carbon nanotube channel region 108c. As shown below with respect to FIG. 8, preserving the channel region 108c in its cylindrical form preserves the bandgap in this region.

Figure 5:
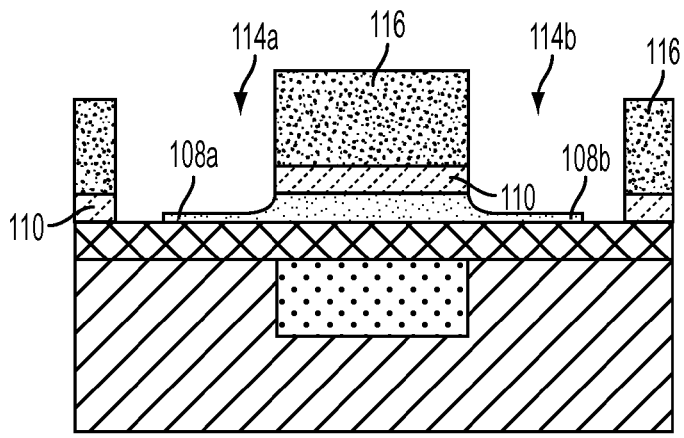

FIG. 5 illustrates a fifth stage of the manufacturing process. Resist 116 is applied to the surface of the transistor and developed to reopen windows 114a and 114b in the contact regions of the carbon nanotube 108, i.e., at the unrolled ends 108a and 108b of the carbon nanotube 108.

Figure 6:
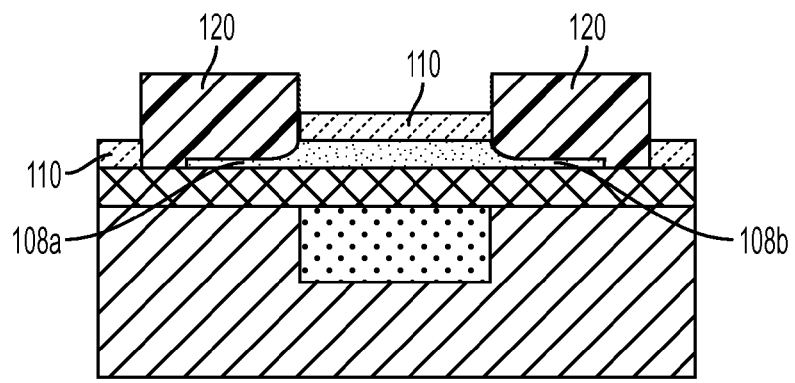

FIG. 6 illustrates a sixth stage of the manufacturing process. Contact metal 120 is deposited in the window areas 114a and 114b onto the contact regions 108a and 108b of the carbon nanotube 108. The contact metal 120 such as palladium for p-type or erbium for n-type transistors may be deposited by electron-beam deposition or other suitable method. The contact metal 120 thus couples to planar surfaces of the contact regions 108a and 108b. Additionally, the contact metal may couple to the free edges of the contact regions 108a and 108b, thereby forming covalent bonds with the dangling bonds of the free edges. The resist 116 is then lifted off of exposed surfaces to complete the carbon nanotube field effect transistor. A subsequent anneal at temperatures in the range from about 200° C. to about 400° C. in one of $N_2$, forming gas, or vacuum may provide further improvements in contact resistance.

Figure 7:
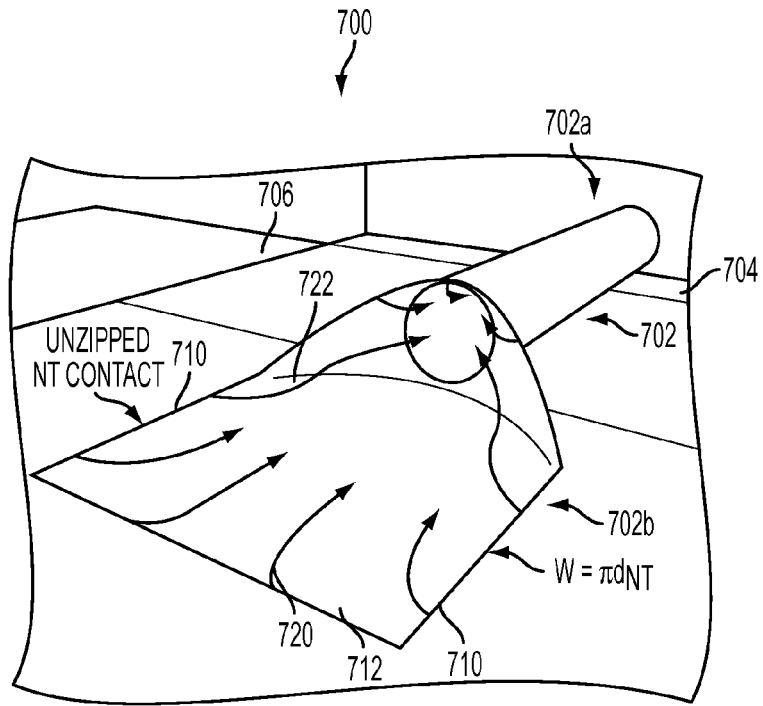
FIG. 7 shows an exemplary contact formed using the exemplary manufacturing processes disclosed herein.

FIG. 7 shows an exemplary contact 700 formed using the exemplary process disclosed herein. Carbon nanotube 702 includes a cylindrical channel region 702a and an unzipped contact region 702b. The cylindrical channel region 702a spans the gated section of the transistor. The unzipped contact region 702b is laid substantially flat against the high-k dielectric 704 and contact 706 is formed thereon. The width W of the unzipped contact region 702b is related to the diameter $d_{CNT}$ of the carbon nanotube ($W=\pi d_{CNT}$). The unzipped contact region 702b and the contact 706 form a substantially seamless contact. Current enters the unzipped contact region 702b from the contact 706 either at the free edges 710 (as shown by exemplary current 720) or through the surface 712 (as shown by exemplary current 722).

Figure 8:
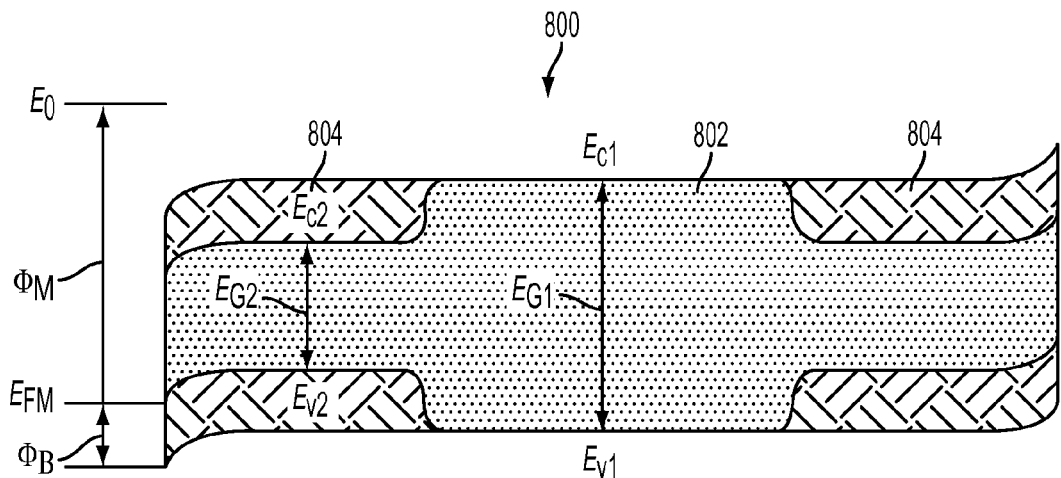
FIG. 8 shows an exemplary band gap diagram of a carbon nanotube that has two ends that have been unzipped and to lie flat as disclosed herein.

FIG. 8 shows an exemplary band gap diagram 800 of a carbon nanotube that has ends that have been unzipped and flattened as disclosed herein to form a carbon nanotube field-effect transistor. The exemplary band gap diagram 800 includes a first bandgap region 802 that corresponds to the bandgap of the cylindrical channel region 702a of the carbon nanotube of FIG. 7, also referred to herein as the channel region. The exemplary band gap diagram 800 also includes second bandgap regions 804 that correspond to a band gap diagram for the unzipped contact regions 702b of the carbon nanotube of FIG. 7. In the band gap diagram 800, $E_0$ is a vacuum energy level. Energy gap $E_{G1}$ is an energy gap of the carbon nanotube in the cylindrical channel region 702a and is the energy difference between a valence band energy level $E_{V1}$ and the conduction band energy level $E_{C1}$ in the channel region. In various aspects, the energy gap $E_{G1}$ is inversely proportional to a diameter of the carbon nanotube ($E_{G1} \sim 1/d_{CNT}$). $E_{G2}$ is the energy gap in the unzipped region of the carbon nanotube that forms the contacts to the source and/or drain. The $E_{G2}$ is the energy difference between valence band energy level $E_{V2}$ and conduction band energy level $E_{C2}$.

In an exemplary embodiment, energy band gap $E_{G2}$ in unzipped region 702b is less than the energy band gap $E_{G1}$ in the cylindrical channel region 702a. For example, for a 1.2 nm carbon nanotube, the band gap values for the carbon nanotube channel region $E_{G1}$ ranges from about 650 meV to about 700 meV and the width of the unzipped region is approximately 3.8 nm. Experimentally, the band gap of the unzipped contact region $E_{G2}$ is $Eg=\alpha/W$, wherein $\alpha=0.7-1.5$ i.e. the bandgap of a graphene nanoribbon. Thus, the band gap values for the unzipped region $E_{G2}$ ranges from about 185 meV to about 395 meV, roughly half of the channel bandgap $E_{G1}$.

$E_{FM}$ is the Fermi level of the metal or a potential energy level for an electron as defined by the Fermi-Dirac distribution, for example. $\Phi_m$ is a metal work function of the contact metal or the energy required to move an electron from a Fermi energy level to the vacuum level. A Schottky barrier is denoted by $\Phi_B$. The Schottky barrier $\Phi_B$ is defined as the difference between a minimum in the conduction band and the metal Fermi level $E_{FM}$ for an n-type semiconductor and is a difference between the valence band maximum and the metal Fermi level for a p-type semiconductor. The Schottky barrier arises from a mismatch between the semiconductor Fermi level and the contact metal Fermi level at the interface. The Schottky barrier $\Phi_B$ generally is present when the band gap is within a range that is useful for digital transistors ~0.6 eV. The Schottky barrier generally inhibits current injection into a valance band for a p-type device. As shown in the exemplary band gap diagram 800, the Schottky barrier rises to a level above $E_{V2}$. Thus for a carbon nanotube device without unzipped or flattened ends (i.e., where $E_{V2}=E_{V1}$ and $E_{G2}=E_{G1}$), the Schottky barrier inhibits injection of electrons directly into the contact region 702b. Similar arguments can be made for inhibiting injection into the conduction band for an n-type device. The band diagram 800 also shows that for the second bandgap region 804 (where $E_{G2}<E_{G1}$ and $E_{V2}$ is close to $E_{FM}$) the Schottky barrier is much smaller or vanishes altogether in the unzipped contact region 702b. Therefore, reducing the energy gap $E_g$ in the second bandgap region 804 lowers the Schottky barrier. As a result, the contact resistance associated with the Schottky barrier is reduced or eliminated. Thus, an applied bias in the gated region 702b simply modulates $E_{G1}$ and therefore the current through the channel as in a conventional metal-oxide-semiconductor (MOS) device.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the exemplary embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of forming a semiconductor device, the method comprising:
   unzipping an end of a carbon nanotube to provide a carbon nanotube with a substantially flat surface at the end;
   forming a contact of the semiconductor device; and
   coupling the substantially flat surface at the end of the carbon nanotube to the contact to form the semiconductor device.

2. The method of claim 1, wherein unzipping the end of the carbon nanotube further comprises one of forming a longitudinal cut at the end of the carbon nanotube and forming a spiral cut at the end of the carbon nanotube.

3. The method of claim 1, further comprising coupling a free edge of the substantially flat surface of the carbon nanotube to the contact.

4. The method of claim 1, further comprising sandwiching the substantially flat surface of the carbon nanotube between the contact and a substrate of the semiconductor device.

5. The method of claim 4, further comprising disposing the carbon nanotube on a surface of a high-k dielectric, unzipping the end of the carbon nanotube to provide the substantially flat surface on the surface of the high-k dielectric, and forming the contact on top of the substantially flat surface of the carbon nanotube.

6. The method of claim 1, wherein coupling the substantially flat surface to the contact reduces a contact resistance between the contact and the carbon nanotube.

7. The method of claim 1, wherein the contact is one of a source contact and a drain contact and the carbon nanotube is a gated channel of the semiconductor device.

8. A method of forming a carbon nanotube field-effect transistor, comprising:
   unzipping an end segment of the carbon nanotube and unrolling the unzipped end segment to form a substantially planar surface; and
   coupling the unzipped end segment of the carbon nanotube to a contact to form the carbon nanotube field-effect transistor.

9. The method of claim 8, wherein unzipping the end segment of the carbon nanotube and unrolling the unzipped end segment to form a substantially planar surface reduces an energy gap in the end segment of the carbon nanotube.

10. The method of claim 8, wherein unzipping the end segment further comprises one of forming a longitudinal cut at the end segment of the carbon nanotube and forming a spiral cut at the end segment of the carbon nanotube.

11. The method of claim 8, further comprising coupling an edge of the substantially planar surface to the contact.

12. The method of claim 8, further comprising sandwiching the unzipped end segment of the carbon nanotube between the contact and a substrate of the field effect transistor.

13. The method of claim 8, wherein coupling the unzipped end segment to the contact reduces a contact resistance between the contact and the carbon nanotube.

14. The method of claim 8, wherein the contact is one of a source contact and a drain contact and the carbon nanotube is a gated channel.

15. A method of reducing a contact resistance in a carbon nanotube transistor, comprising:
   unzipping an end segment of a carbon nanotube to provide a carbon nanotube with an unzipped end segment;
   forming a planar surface from the unzipped end segment of the carbon nanotube; and
   coupling the planar surface to a contact of the carbon nanotube transistor.

16. The method of claim 15, wherein unzipping the end segment of the carbon nanotube further comprises one of forming a longitudinal cut at an end of the carbon nanotube and forming a spiral cut at an end of the carbon nanotube.

17. The method of claim 15, wherein coupling the planar surface to the contact further comprises forming a covalent bond between the contact and a dangling carbon bond at an edge of the planar surface.

18. The method of claim 15, further comprising sandwiching the planar surface between a substrate and the contact.

19. The method of claim 15, wherein unzipping the end segment reduces an energy gap in the unzipped segment with respect the energy gap of the carbon nanotube outside of the unzipped segment.

20. The method of claim 15, wherein the contact is one of a source contact and a drain contact and the carbon nanotube is a gated channel.

* * * * *